United States Patent
Biber et al.

(10) Patent No.: US 9,978,627 B2
(45) Date of Patent: May 22, 2018

(54) SYSTEM AND METHOD FOR SELECTIVE ZAPPING

(71) Applicant: Applied Materials Israel, Ltd., Rehovot (IL)

(72) Inventors: Tuvia Biber, Rishon-Lezion (IL); Efim Kerner, Rehovot (IL); Efraim Siman Tov, Rehovot (IL)

(73) Assignee: APPLIED MATERIALS ISRAEL LTD, Rehovot (IL)

( * ) Notice: Subject to any disclaimer, the term of this patent is extended or adjusted under 35 U.S.C. 154(b) by 290 days.

(21) Appl. No.: 14/995,088

(22) Filed: Jan. 13, 2016

(65) Prior Publication Data

US 2017/0200627 A1     Jul. 13, 2017

(51) Int. Cl.
| | |
|---|---|
| H01L 21/683 | (2006.01) |
| H01L 21/326 | (2006.01) |
| H01L 21/66 | (2006.01) |
| H05F 3/00 | (2006.01) |

(52) U.S. Cl.
CPC ........ *H01L 21/6833* (2013.01); *H01L 21/326* (2013.01); *H01L 22/14* (2013.01); *H01L 22/26* (2013.01); *H05F 3/00* (2013.01)

(58) Field of Classification Search
CPC ... H01L 21/14; H01L 21/326; H01L 21/6831; H01L 21/6833; H05F 3/00–3/02
See application file for complete search history.

(56) References Cited

U.S. PATENT DOCUMENTS

| | | | |
|---|---|---|---|
| 8,094,428 B2 * | 1/2012 | Wang | B82Y 10/00 361/234 |
| 8,110,818 B2 | 2/2012 | Wang et al. | |
| 8,218,284 B2 | 7/2012 | Chen et al. | |
| 8,294,094 B1 | 10/2012 | Zhao et al. | |
| 8,604,428 B2 | 12/2013 | Wang et al. | |
| 8,908,348 B2 * | 12/2014 | Wang | B82Y 10/00 361/234 |
| 9,805,964 B2 * | 10/2017 | Biber | H01L 21/326 |
| 2010/0103583 A1 * | 4/2010 | Wang | B82Y 10/00 361/234 |
| 2010/0110603 A1 * | 5/2010 | LaFontaine | H01L 21/6831 361/234 |

(Continued)

OTHER PUBLICATIONS

U.S. Appl. No. 15/069,943, "Non Final Office Action", dated Mar. 2, 2017, 7 pages.

*Primary Examiner* — Thienvu Tran
*Assistant Examiner* — Christopher Clark
(74) *Attorney, Agent, or Firm* — Kilpatrick Townsend & Stockton LLP (57) ABSTRACT

A system for zapping a wafer, the system includes a pulse generator; a sensor; a first conductive interface; a second conductive interface; a controller; wherein the pulse generator is configured to generate zapping pulses; wherein the first conductive interface is configured to provide the zapping pulses to a first location of a backside insulating layer of a wafer; wherein the sensor is configured to monitor a coupling between the first conductive interface and the second conductive interface to provide a monitoring result; wherein the monitoring occurs while the second conductive interface contacts a second location of the backside insulating layer; and wherein the controller is configured to control a generation of the zapping pulses in response to the monitoring result.

15 Claims, 12 Drawing Sheets

(56) References Cited

U.S. PATENT DOCUMENTS

2010/0288923 A1 11/2010 Wang et al.
2011/0051306 A1 3/2011 Wang et al.
2015/0049411 A1* 2/2015 Wang .................. H01L 21/6831
  361/234

* cited by examiner

SYSTEM AND METHOD FOR SELECTIVE ZAPPING

BACKGROUND OF THE INVENTION

A wafer can be irradiated by one or more charged particle beams during the manufacturing process of the wafer and even after the end of the manufacturing process of the wafer.

One unwanted side effect of the irradiation is the charging the wafer. The charging can be reduced and even eliminated by grounding the wafer.

A wafer may have a backside insulating layer that may prevent the grounding of the wafer. In order to allow the grounding there is a need to form holes in the backside insulating layer.

The Holes may be formed in the backside insulating layer by zapping the backside insulating layer. The zapping includes supplying high power voltage pulses (referred to as zapping pulses) to the backside insulating layer. The zapping pulses cause a breakdown of the backside insulating layer.

The zapping process is a destructive process that damages the wafer.

There is a growing need to reduce the damage caused by the zapping pulses.

SUMMARY

According to an embodiment of the invention there may be provided a system for zapping a wafer, the system may include a pulse generator, a sensor, a first conductive interface, a second conductive interface and a controller. The pulse generator may be configured to generate zapping pulses. The first conductive interface may be configured to provide the zapping pulses to a first location of a backside insulating layer of a wafer. The sensor may be configured to monitor a coupling between the first conductive interface and the second conductive interface to provide a monitoring result. The monitoring occurs while the second conductive interface contacts a second location of the backside insulating layer. The controller may be configured to control a generation of the zapping pulses in response to the monitoring result.

The sensor may be configured to detect an occurrence of breakdowns of the backside insulating layer in the first location and in the second location; and the controller may be configured to stop the generating of the zapping pulses in response to a detection of the occurrence of the breakdowns.

The sensor may be configured to detect occurrence of the breakdowns of the backside insulating layer in the first location and in the second location when an electrical signal that passes through the second conductive interface exceeds an intensity threshold.

The controller may be configured to control at least one out of an intensity of the zapping pulses, duration of the zapping pulses and an interval between adjacent zapping pulses.

The pulse generator may include an output stage that may be configured to (a) output the zapping pulses when operating at a zapping mode, and (b) receive discharge current that passes through the first conductive interface when operating in a discharge mode.

The first conductive interface may be coupled to the pulse generator via a resistor that may be configured to limit a current of the zapping pulses below a predefined current threshold.

The first conductive interface may be coupled to the pulse generator via a resistive path.

The system may include an electrostatic chuck for supporting the wafer. The first conductive interface and the second conductive interface may be configured to propagate through holes formed in the electrostatic chuck.

According to an embodiment of the invention there may be provided a method for zapping a wafer, the method may include: generating, by a pulse generator, zapping pulses; supplying, by a first conductive interface, the zapping pulses to a first location of a backside insulating layer of a wafer; contacting a second location of the backside insulating layer by a second conductive interface; monitoring, by a sensor, a coupling between the first conductive interface and the second conductive interface to provide a monitoring result; and controlling, by a controller, the generating of the zapping pulses in response to the monitoring result.

According to an embodiment of the invention there may be provided a system for zapping a wafer, the system may include a pulse generator, a sensor, a first conductive interface, a second conductive interface and a controller. The pulse generator may be configured to generate zapping pulses. The first conductive interface may be configured to provide the zapping pulses to a first location of a backside insulating layer of a wafer. The sensor may be configured to detect an occurrence of a breakdown of the backside insulating layer by monitoring an electrical signal that passes through the second conductive interface and through a second location of the backside insulating layer as a result of the zapping pulses. The controller may be configured to stop the generating of the zapping pulses in response to a detection of the occurrence of the breakdown.

The first conductive interface may be coupled to the pulse generator via a resistor that may be configured to limit a current of the zapping pulses below a predefined current threshold.

The first conductive interface may be coupled to the pulse generator via a resistive path.

The pulse generator may include an output stage that may be configured to (a) output the zapping pulses when operating at a zapping mode, and (b) receive discharge current that passes through the first conductive interface when operating in a discharge mode.

The system may include a diode for alternating current (DIAC) that may be configured to prevent peaks of the electrical signal that may be below a breakout voltage of the DIAC to reach the sensor.

The system may include an electrostatic chuck for supporting the wafer; and wherein the first conductive interface and the second conductive interface may be configured to propagate through holes formed in the electrostatic chuck.

According to an embodiment of the invention there may be provided a method for zapping a wafer, the method may include: generating, by a pulse generator, zapping pulses; supplying, by a first conductive interface, the zapping pulses to a first location of a backside insulating layer of a wafer; contacting a second location of the backside insulating layer by a second conductive interface; monitoring, by a sensor, an electrical signal that passes through the second conductive interface, to detect occurrence of a breakdown of the backside insulating layer; wherein the electrical signal passes through the second location of the backside insulating layer as a result of the supplying of the zapping pulses; and stopping the generating of the zapping pulses in response to the detection of the occurrence of the breakdown.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 1:
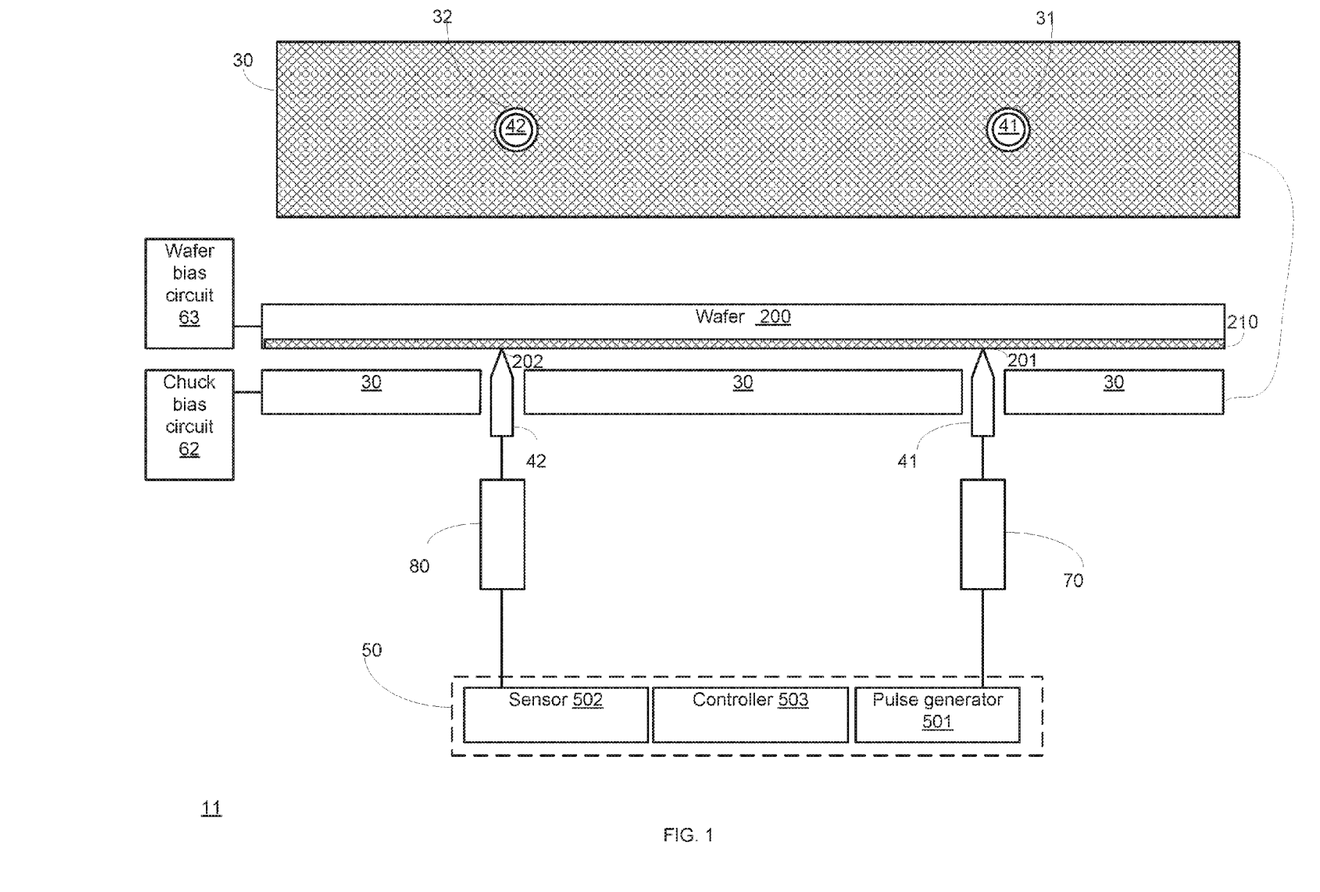
FIG. 1 illustrates a system and a wafer according to an embodiment of the invention.

FIG. 1 illustrates a system 11 and a wafer 200 according to an embodiment of the invention.

Wafer 200 is illustrated as including backside insulating layer 210.

System 11 includes:
a. Wafer bias circuit 63 for biasing wafer 200.
b. Chuck 30 that includes spaces 31 and 32. Chuck 30 is configured to support wafer 200.
c. Chuck bias circuit 62 for biasing chuck 30.
d. First conductive interface 41 for supplying zapping pulses to a first location 201 of backside insulating layer 210.
e. Second conductive interface 42 for receiving, under certain conditions, an electrical signal resulting from the provision of the zapping pulses to the wafer 200.
f. Pulse generator 501 for generating the zapping pulses.
g. Sensor 502.
h. First network 80 for coupling the pulse generator 501 to the first conductive interface.
i. Second network 70 for coupling the second conductive interface 42 to the sensor 502.
j. Controller 503.

The first conductive interface 41 may be shaped as a pin or may have any other shape. It is beneficial to contact the wafer with a tip or otherwise small cross section area.

The first conductive interface may be positioned within space 31.

Second conductive interface 42 is configured to contact a second location 202 of backside insulating layer 210. The second conductive interface may be shaped as a pin or may have any other shape.

The second conductive interface may be positioned within space 32.

Each one of the first network 80 and the second network 70 may be a conductor, a resistor, and the like.

According to an embodiment of the invention the first network 80 provides a resistive path between the pulse generator and the first conductive interface 41. The resistive path may exclude a capacitor or may have only an insignificant capacitance.

When providing a pulse through a capacitor—the capacitor discharges energy even after the pulse ends. Using a resistive path improves the control over the zapping pulses—as the resistive path allows to immediately stop the provision of energy to the wafer. Once a breakdown is detected by sensor 502 the provision of any zapping energy may cause unnecessary damage to the wafer.

The first conductive interface 41 and the second conductive interface 42 may be electrically coupled to each other through wafer 200. Once breakdowns occur in first location 201 and in second location 202—an electrical signal may propagate through non-insulating layers of wafer 200 and be detected by sensor 502. The electrical signal is generated as result of one or more zapping pulses.

Sensor 502 may monitor the electrical signal and output a monitoring result. The sensor 502 may determine when breakdowns occur and may also determine the manner (or degree) in which the first conductive interface and the second conductive interface are electrically coupled to each other.

Controller 503 may receive the monitoring result and control the generation of the zapping pulses. The controlling may include instructing the pulse generator 501 to stop (even immediately) the generation of the zapping pulses once a breakdown is detected. The term immediately may mean within few nanoseconds.

Controller 503 may be configured to control one or more parameter out of (i) the intensity of the zapping pulses, (ii) the duration of the zapping pulses, and (iii) interval between adjacent zapping pulses.

There may be tradeoff between the speed of achieving the breakdowns and between the amount of power or energy of one or more zapping pulse that is provided to the wafer after the occurrence of the breakdowns.

One trade-off may involve reducing the intensity and/or the duration of the zapping pulses over time in order to reduce the energy or power of the zapping pulses generated closer to the occurrence of the breakdowns.

Controller 503, pulse generator 501 and sensor 502 may form a pulse generating, sensing and controlling unit 50.

The pulse generating, sensing and controlling unit 50 can be biased and/or grounded.

Figure 2:
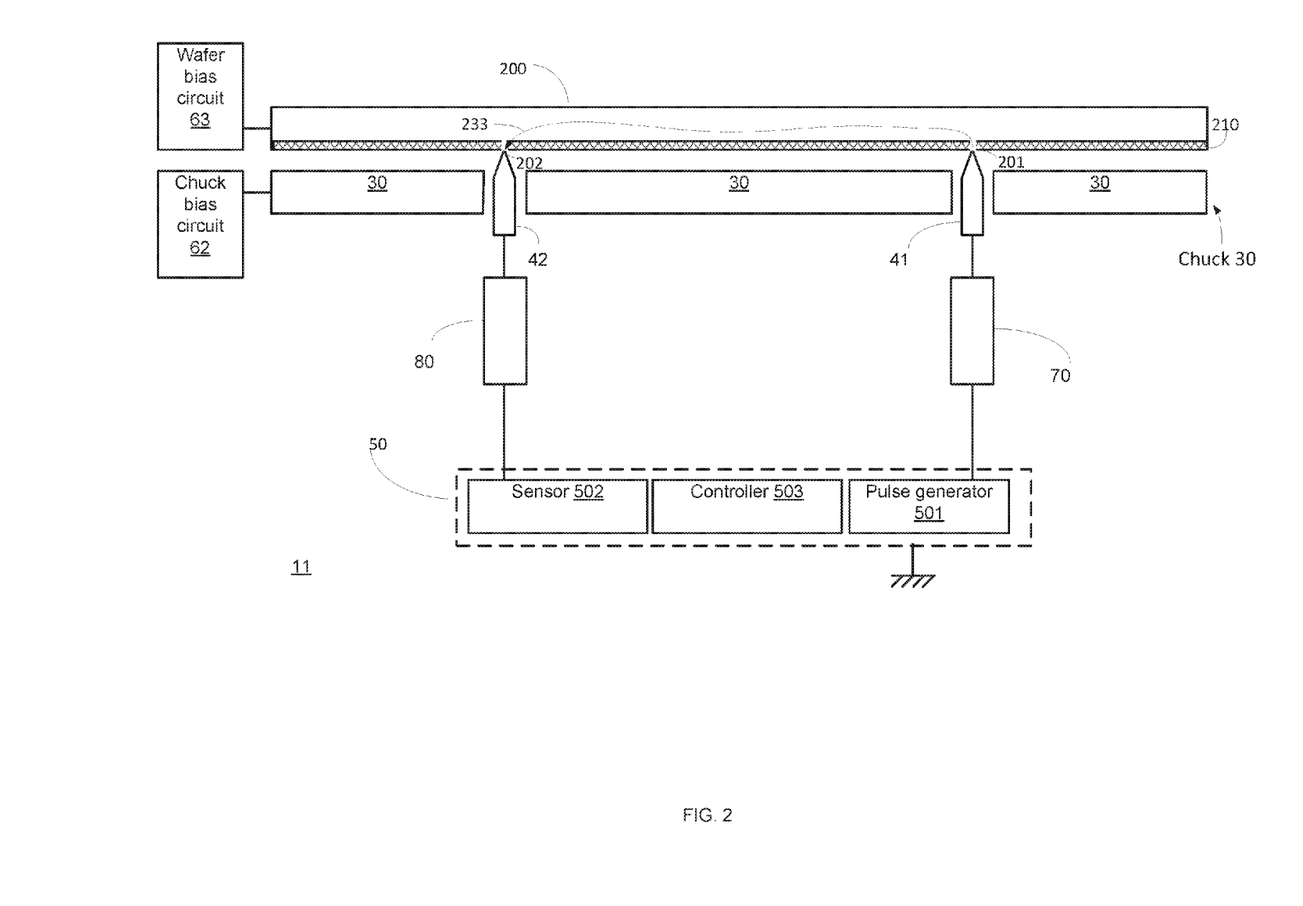
FIG. 2 illustrates a system and a wafer according to an embodiment of the invention.

FIG. 2 illustrates a system 11 and a wafer 200 according to an embodiment of the invention.

While FIG. 1 illustrates the backside insulating layer 210 before the formation of the breakdowns—FIG. 2 illustrates the breakdowns (in first location 201 and in second location 202). Accordingly—zapping pulses result in a flow of an electrical signal 233 through wafer 200 and between the first conductive interface 41 and the second conductive interface 42.

Figure 3:
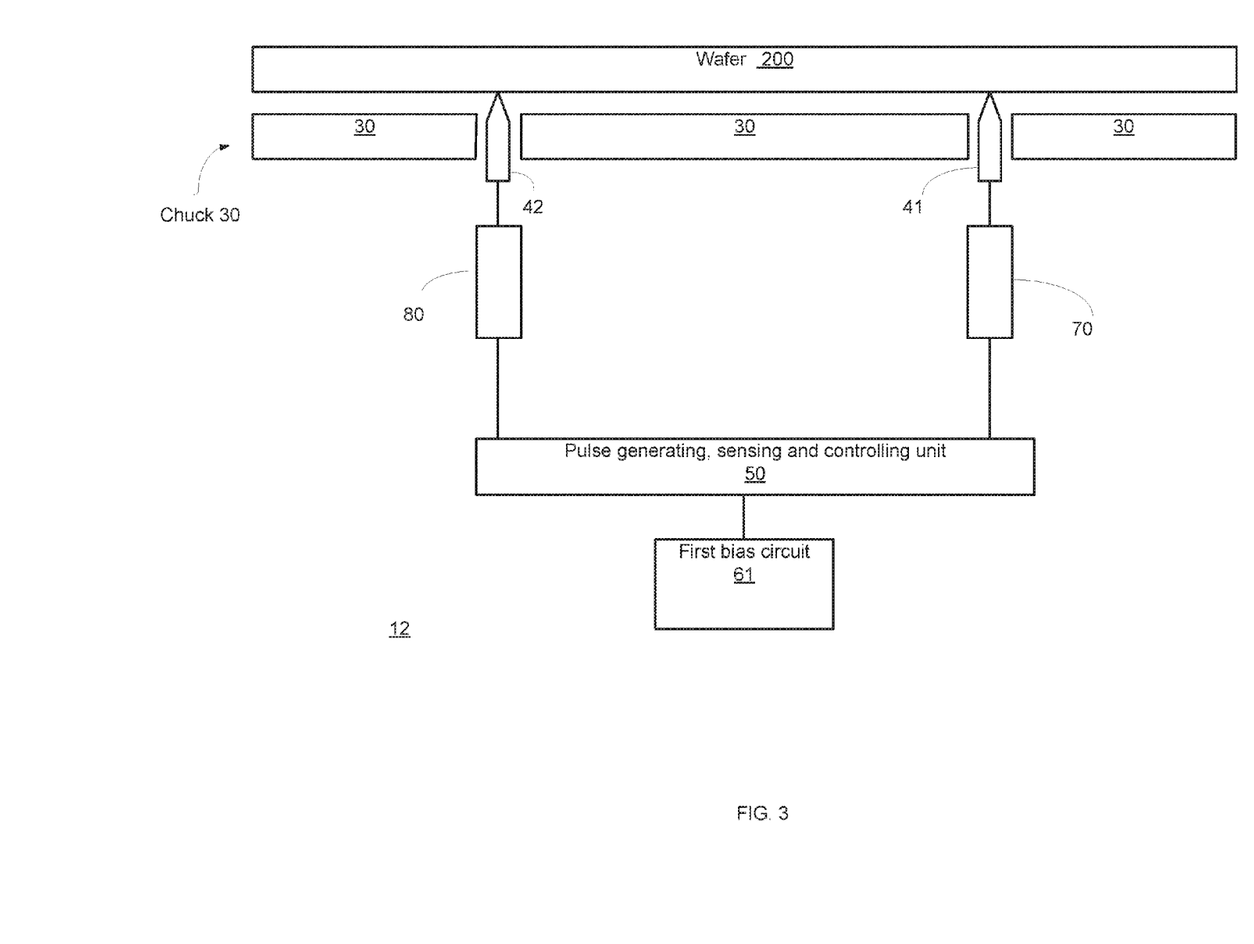
FIG. 3 illustrates a system and a wafer according to an embodiment of the invention.

FIG. 3 illustrates a system 12 and a wafer 200 according to an embodiment of the invention.

In FIG. 3 the pulse generating, sensing and controlling unit 50 is biased by first bias circuit 61.

For simplicity of explanation various figures (such as FIGS. 3, 4, 5, 6, 7 and 8) does not illustrate the chuck bias circuit 62 and the wafer bias circuit 63. Systems 12, 13, 14 and 15 illustrates in FIGS. 3-8 may include chuck bias circuit 62 and/or wafer bias circuit 63.

Figure 4:
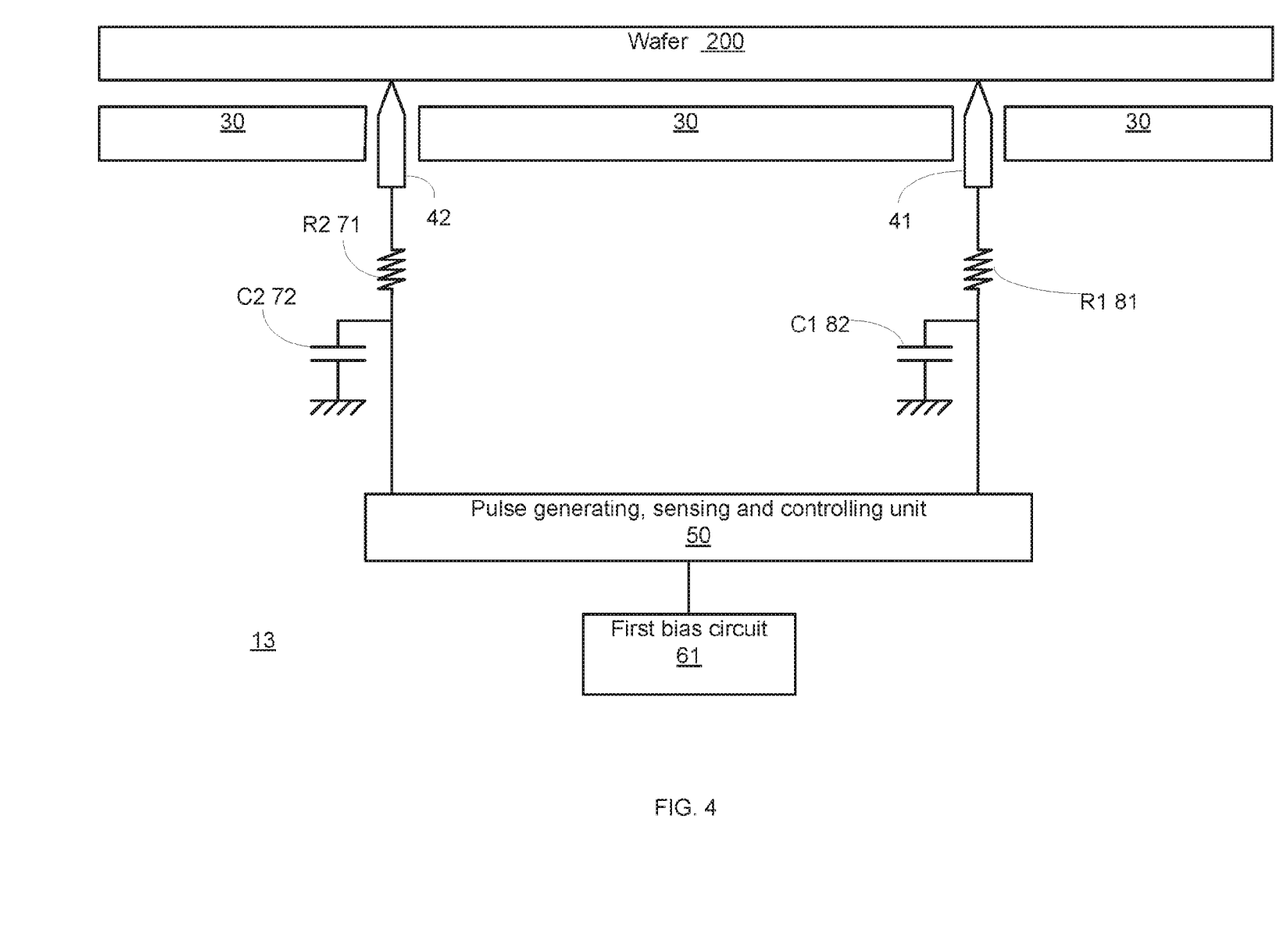
FIG. 4 illustrates a system and a wafer according to an embodiment of the invention.

FIG. 4 illustrates a system 13 and a wafer 200 according to an embodiment of the invention.

FIG. 4 illustrates the first network 80 of FIG. 3 as including a first resistor R1 81 and a first capacitor C1 82.

First resistor R1 81 is serially connected between the first conductive interface 41 and the pulse generator of pulse generating, sensing and controlling unit 50. First capacitor C1 82 is connected between first resistor R1 81 and the ground.

First resistor R1 81 limits the current that reaches the first conductive interface 41 and forms a resistive path between first conductive interface 41 and the pulse generator of pulse generating, sensing and controlling unit 50.

FIG. 4 illustrates the second network 70 of FIG. 3 as including a second resistor R2 71 and a second capacitor C2 72.

Second resistor R1 71 is serially connected between the second conductive interface 42 and the sensor of pulse generating, sensing and controlling unit 50. Second capacitor C1 72 is connected between second resistor R1 71 and the ground.

Figure 5:
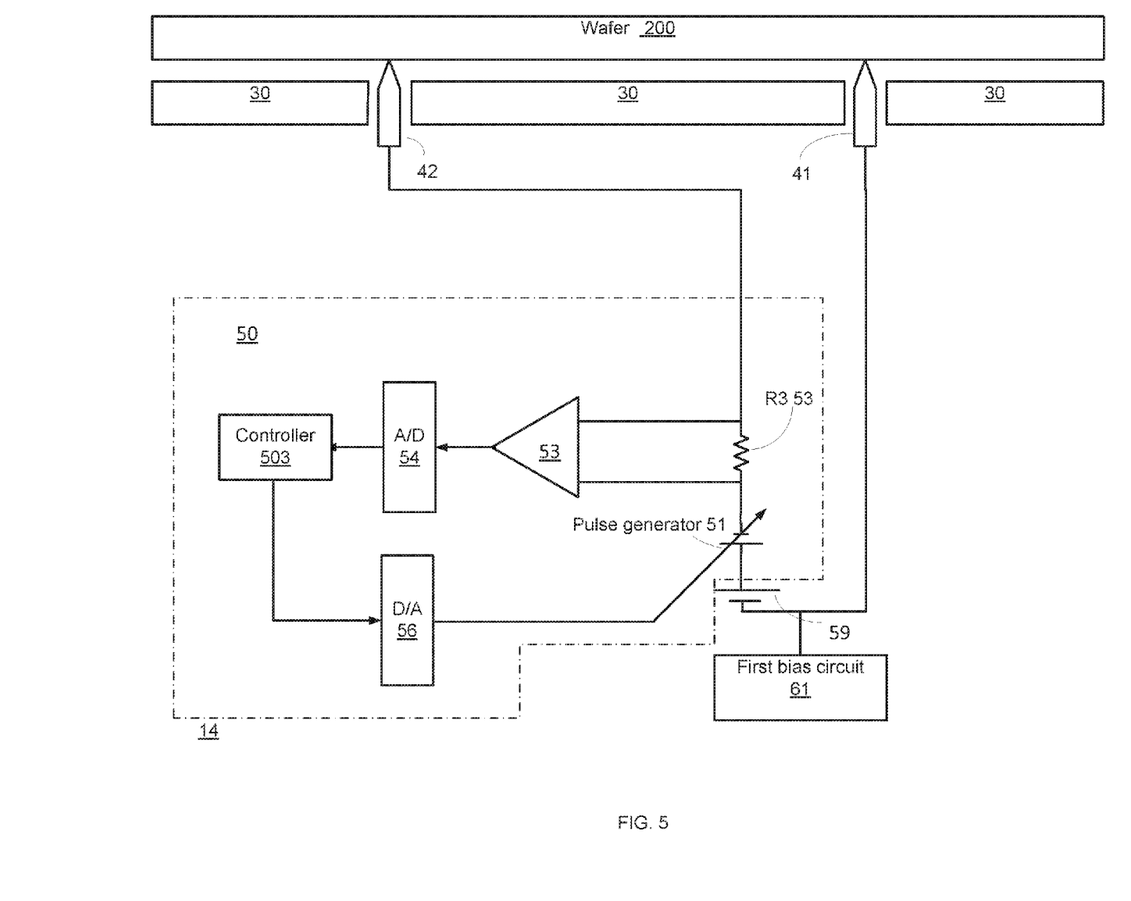
FIG. 5 illustrates a system and a wafer according to an embodiment of the invention.

FIG. 5 illustrates a system 14 and a wafer 200 according to an embodiment of the invention.

In FIG. 5 the pulse generating, sensing and controlling unit 50 is connected via wires to the first conductive interface 41 and to the second conductive interface 42.

The pulse generating, sensing and controlling unit 50 is biased by first bias circuit 61 and is fed, when measuring the success of the zapping, by additional voltage supply 59.

The pulse generating, sensing and controlling unit 50 includes:
  a. Pulse generator 51.
  b. Third resistor R3 53 that is serially connected between pulse generator 51 and second conductive interface 42.
  c. A sense amplifier 53 that is connected in parallel to third resistor R3 53. Sense amplifier 53 is arranged to (i) measure the voltage developed on third resistor R3 53 as a result of a provision of voltage by additional voltage supply 59, and (ii) output an analog measurement signal. The voltage is supplied by additional voltage supply 59 after one or more zapping pulses.
  d. An analog to digital converter (A/D) 54 that is configured to convert the analog measurement signal to a digital measurement signal.
  e. A controller 503 that is configured to generate a control signal for controlling the generation of the zapping pulses in response to the digital measurement signal.
  f. A digital to analog converter (D/A) 56 that is configured to convert the control signal to an analog control signal.

The pulse generator 51 may be controlled by the analog control signal. The pulse generator 51 provides zapping pulses to the first conductive interface 41.

Figure 6A:
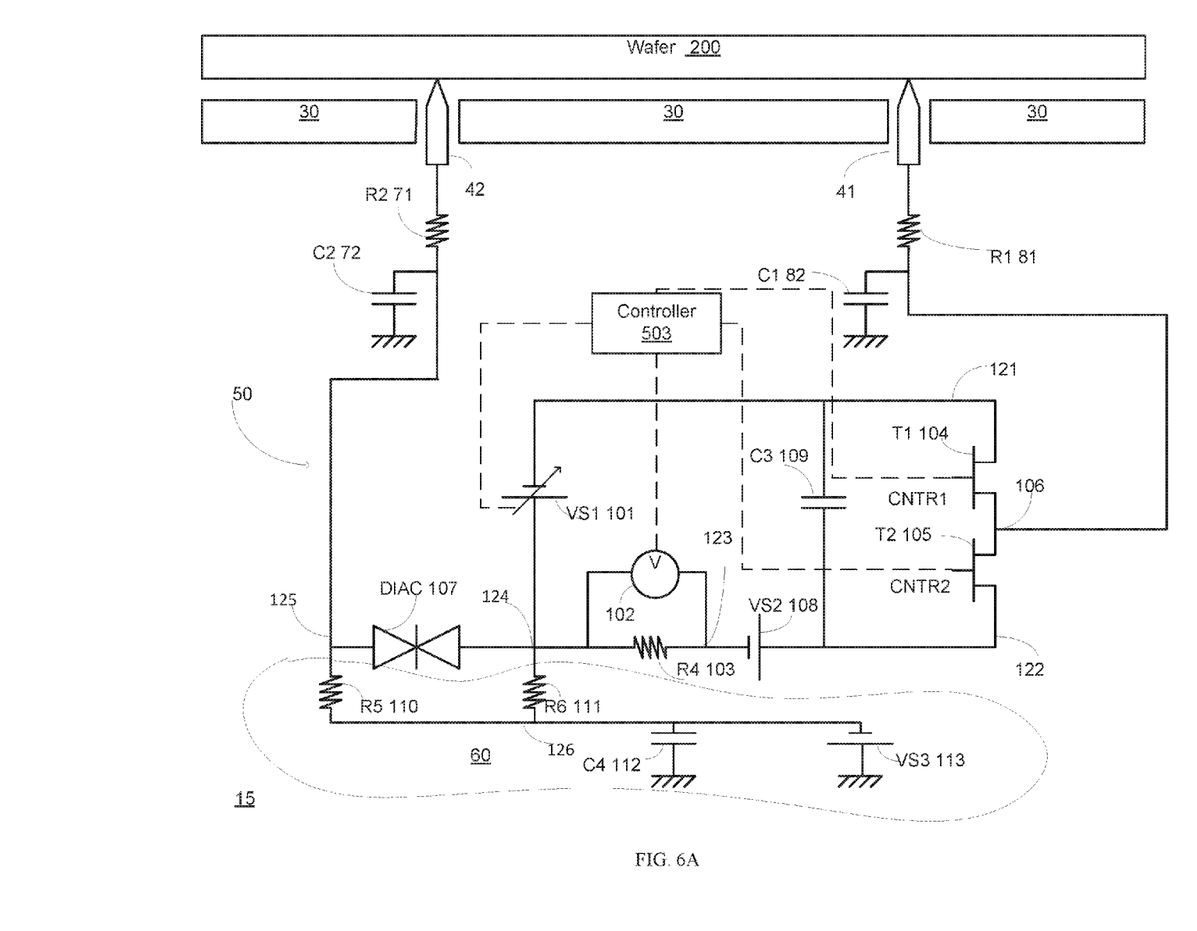
FIG. 6A illustrates a system and a wafer according to an embodiment of the invention.

FIG. 6A illustrates a system 15 and a wafer 200 according to an embodiment of the invention.

In FIG. 6A the pulse generating, sensing and controlling unit 50 is connected via first resistor R1 81 to first conductive interface 41 and via second resistor R2 82 to the second conductive interface 42.

First capacitor C1 82 is connected between first resistor R1 81 and the ground. Second capacitor C1 72 is connected between second resistor R1 71 and the ground.

In FIG. 6A the pulse generating, sensing and controlling unit 50 is biased by a first bias circuit 60.

The pulse generating, sensing and controlling unit 50 is illustrated as including:
  a. Controller 503.
  b. An output stage that includes first transistor T1 104 and second transistor T2 105. First transistor T1 104 is serially connected to second transistor T2 105 output node 106. The output stage is connected between first node 121 and second node 122.
  c. Third capacitor C3 109 that is connected between the first node 121 and the second node 122.
  d. First variable voltage supply VS1 101 that is connected between the first node 121 and a fourth node 124. The first variable voltage supply VS1 101 outputs a zapping voltage that is modulated by first transistor T1 104 to provide zapping pulses.

e. Fourth resistor R4 103 that is connected between fourth node 124 and third node 123.
f. Second voltage supply VS2 108 that is connected between second node 122 and third node 123. VS2 108 provides voltage to fourth resistor R4 54 when checking the success of the zapping.
g. A sensor such as voltmeter 102 that is connected in parallel to fourth resistor R4 103 and is configured to measure the voltage developed on fourth resistor R4 as a result of a voltage provided by second voltage supply VS2.
h. DIAC 107 that is connected between the fourth node 124 and fifth node 125.

Controller 503 controls the duration of the zapping pulses and the interval between adjacent pulses by selectively opening first transistor T1 104 using control signal CNTR1.

The first bias circuit 60 is illustrated as including:
a. Fifth resistor R5 110 that is connected between fifth node 125 and sixth node 126.
b. Sixth resistor R5 110 that is connected between fourth node 124 and sixth node 126.
c. Fourth capacitor C4 112 that is coupled between the ground and the sixth node 126.
d. Third voltage supply VS3 113 that is connected between the ground and the sixth node 126.

Non limiting examples of values of various electrical components illustrated in FIG. 6A are provided below:
a. VS1 101 supplies a variable zapping voltage of up to 1000 Volts.
b. VS3 103 supplies a bias voltage of 30 Kilovolts.
c. R2 71 and R1 81 are 50K Ohm resistors.
d. R5 110 is a 100K Ohm resistor.
e. R6 111 is a 160K Ohm resistor.
f. C1 82, C2 72 and C3 109 are 1 microfarad capacitors.
g. C4 112 is a five microfarad capacitor.

Figure 6B:
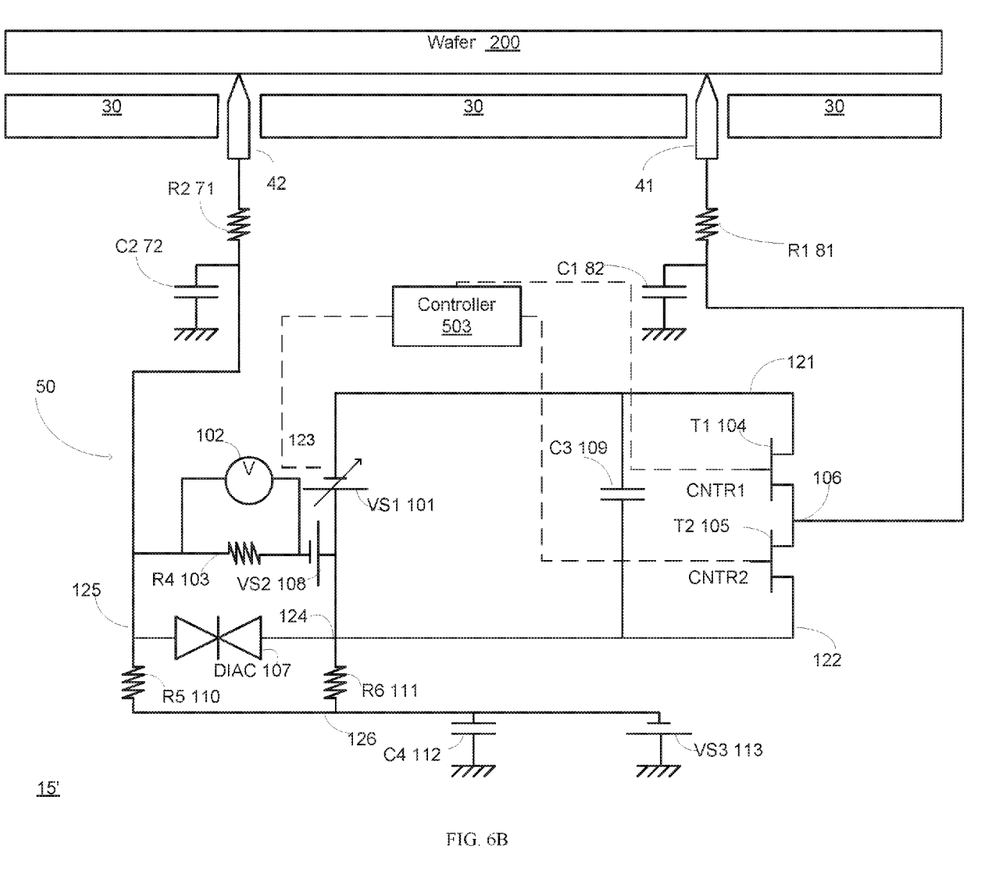
FIG. 6B illustrates a system and a wafer according to an embodiment of the invention.
Figure 6C:
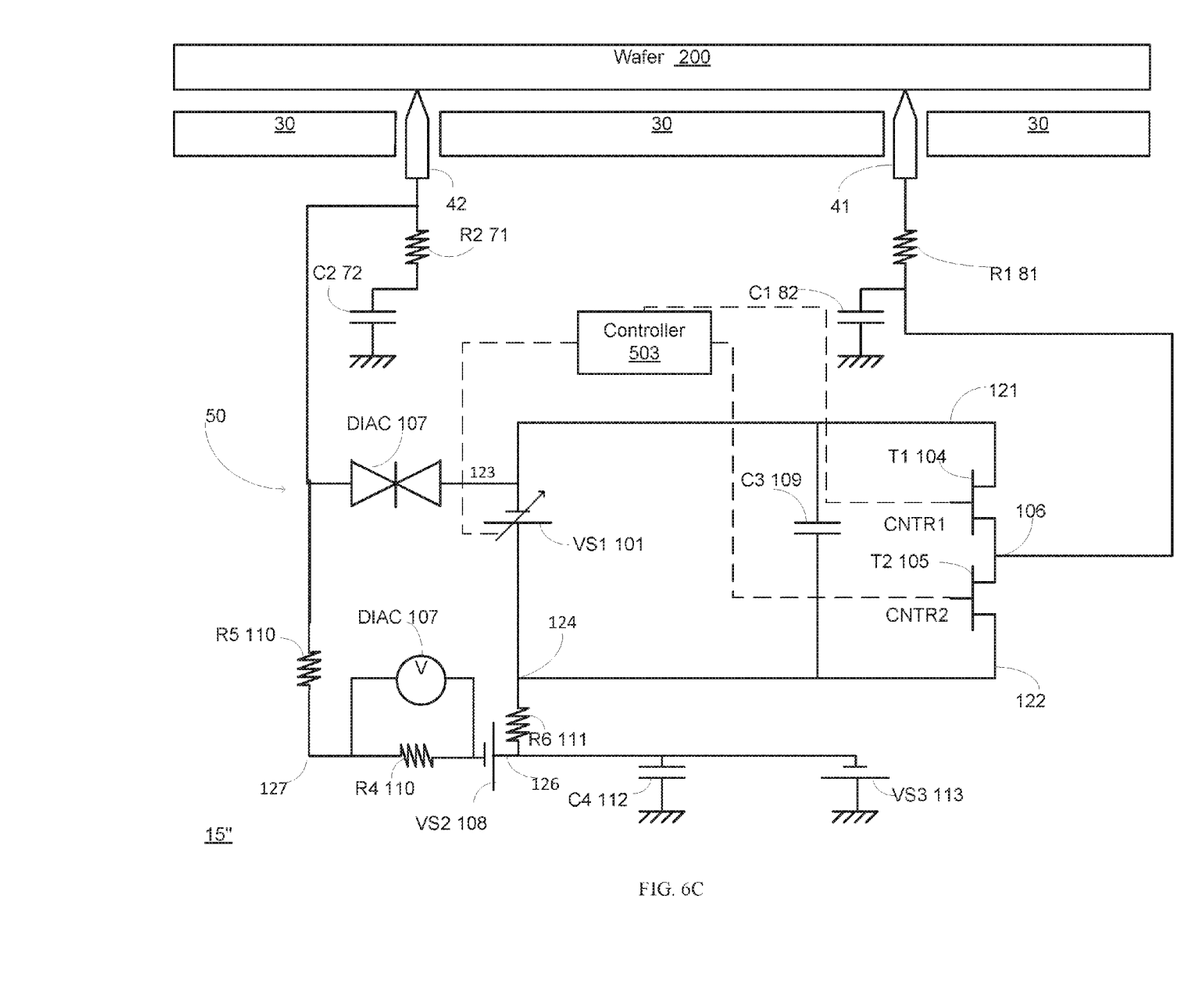
FIG. 6C illustrates a system and a wafer according to an embodiment of the invention.

FIG. 6B illustrates a system 15' and a wafer 200 according to an embodiment of the invention. FIG. 6C illustrates a system 15" and a wafer 200 according to an embodiment of the invention.

System 15 of FIG. 6A, system 15' of FIG. 6B and system 15" of FIG. 6C differ from each other by the location of fourth resistor R4 103, second voltage supply VS2 108 and voltmeter 102.

In system 15 the fourth resistor R4 103 and voltmeter 102 are coupled between fourth node 124 and a first end of second voltage supply VS2 108. A second end of second voltage supply VS2 108 is coupled to second node 122.

In system 15' the fourth resistor R4 103 and voltmeter 102 are coupled between fifth node 125 and a first end of second voltage supply VS2 108. A second end of second voltage supply VS2 108 is coupled to fourth node 124.

In system 15" the fourth resistor R4 103 and voltmeter 102 are coupled between seventh node 127 and a first end of second voltage supply VS2 108. A second end of second voltage supply VS2 108 is coupled to sixth node 126. The seventh node 127 is connected to a second end of R5 110.

Figure 7:
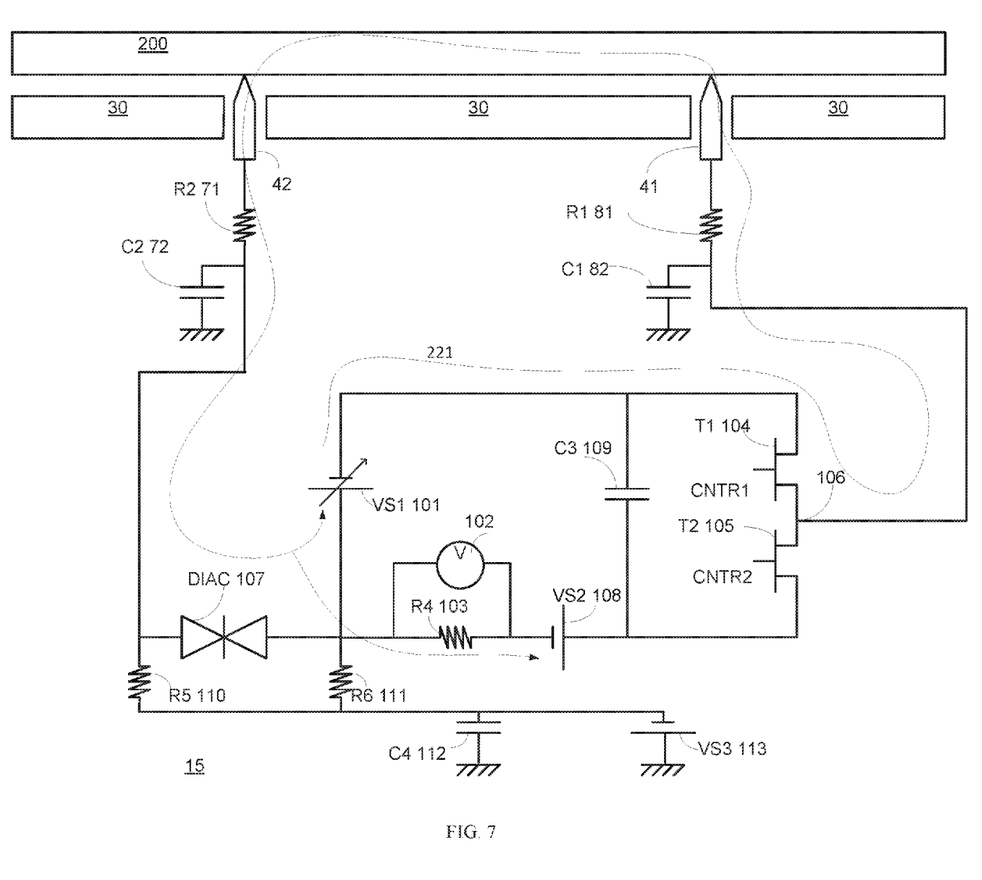
FIG. 7 illustrates a zapping and feedback path through the system of FIG. 6 according to an embodiment of the invention.

FIG. 7 illustrates a zapping and feedback path 221 through system 105 according to an embodiment of the invention.

The zapping and feedback path 221 include a zapping path and a feedback path. The zapping pulses propagate along the zapping path. An electrical signals generated in the wafer in response to the zapping pulses propagate through the feedback path.

The zapping path includes the first variable voltage supply 101, first node 121, first transistor T1 104, output node 106, first resistor R1 81 and first conductive interface 41.

The feedback path include wafer 200, second conductive interface 42, second resistor R2 72, fifth node 125, DIAC 107, fourth node 124, fourth resistor R4 103 and first variable voltage supply 101.

Figure 8:
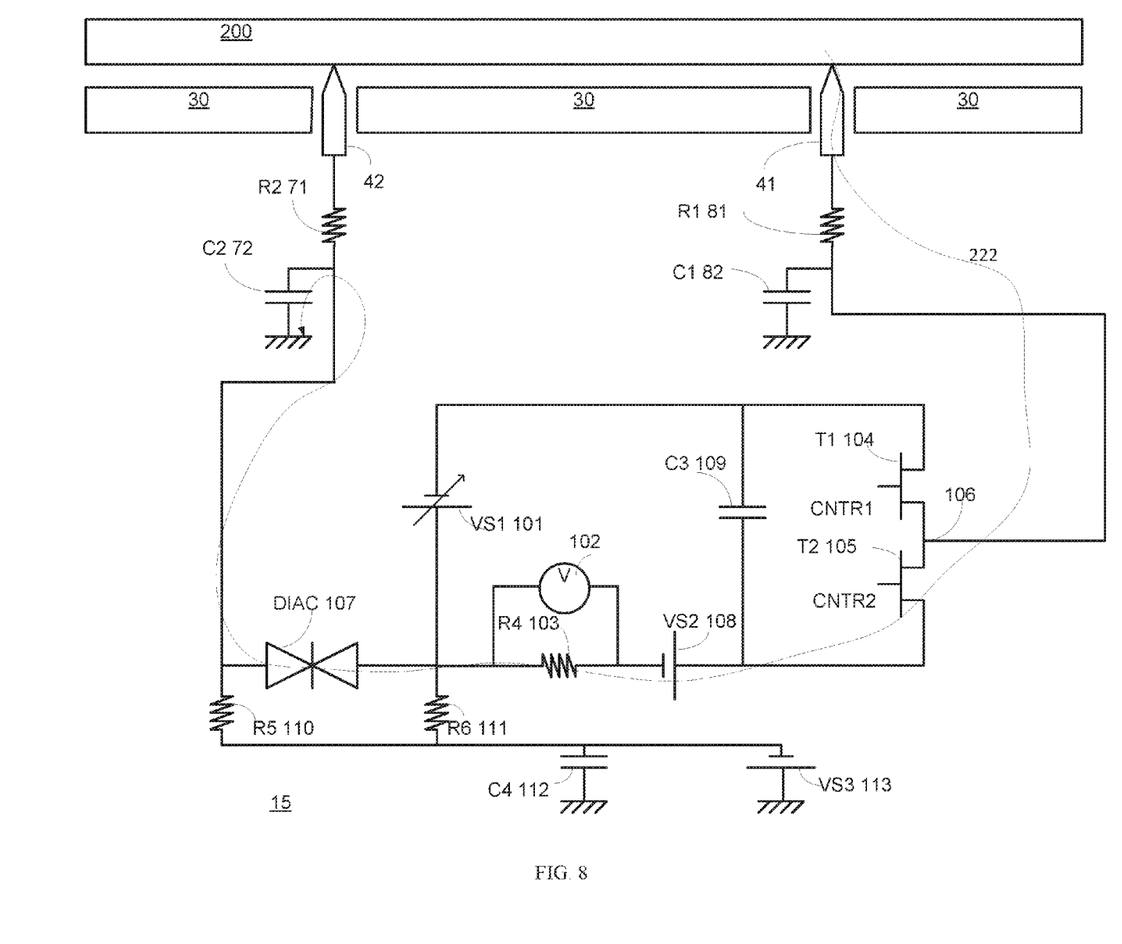
FIG. 8 illustrates a discharge path through the system of FIG. 6 according to an embodiment of the invention.

FIG. 8 illustrates a discharge path 222 through system 105 according to an embodiment of the invention.

After the formation of breakdowns in the first location and the second location and when zapping pulses are not provided, the wafer 200 may discharged via a discharge path.

The discharge path 222 may include first conductive interface 41, output node 106, second transistor T2 105, second node 122, second voltage supply VS2 108, fourth resistor R4 103, fourth node 124, DIAC 107, fifth node 125 and second capacitor C2 72.

Figure 9:
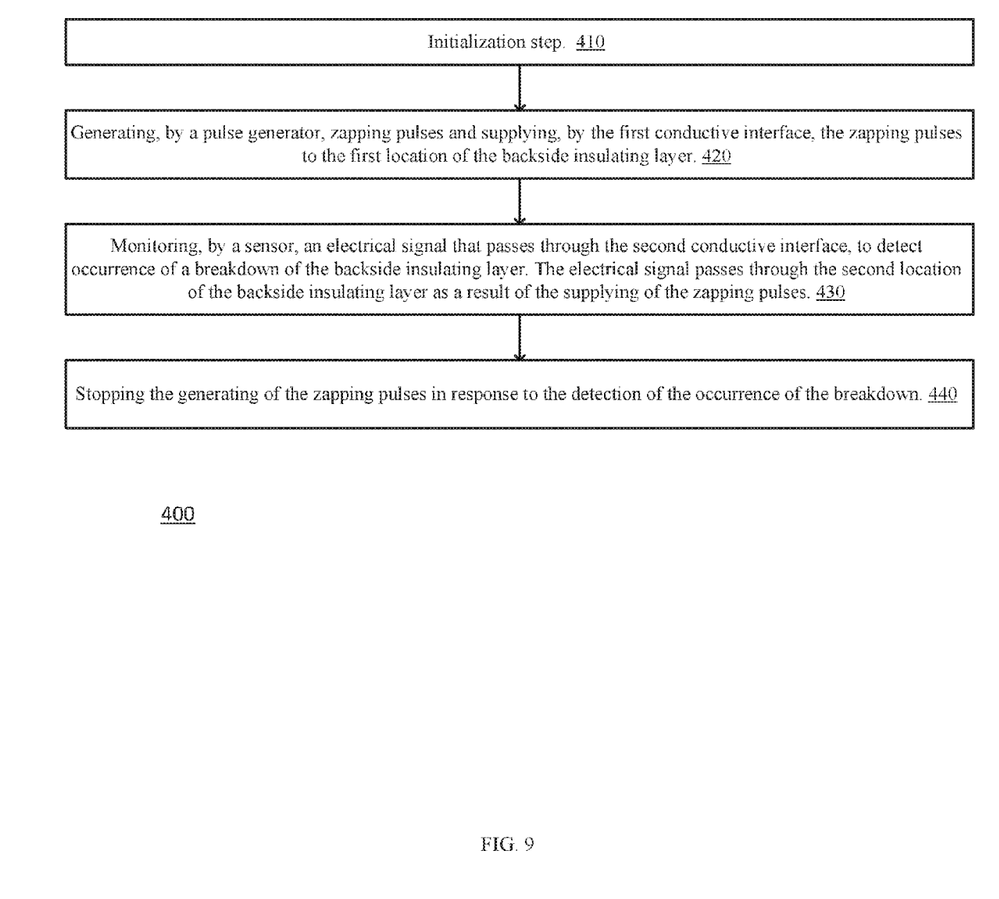
FIG. 9 illustrates a method according to an embodiment of the invention.

FIG. 9 illustrates method 400 according to an embodiment of the invention.

Method 400 may start by initialization step 410.

Initialization step 410 may include at least some of the following steps:
a. Placing the wafer on an electromagnetic chuck.
b. Biasing the wafer.
c. Biasing the chuck.
d. Contacting a first location of backside insulating layer of the wafer by a first conductive interface.
e. Contacting a second location of the backside insulating layer by a second conductive interface.

Initialization step 410 may be followed by step 420 of generating, by a pulse generator, zapping pulses and supplying, by the first conductive interface, the zapping pulses to the first location of the backside insulating layer.

Step 420 may be followed by step 430 of monitoring, by a sensor, an electrical signal that passes through the second conductive interface, to detect occurrence of a breakdown of the backside insulating layer. The electrical signal passes through the second location of the backside insulating layer as a result of the supplying of the zapping pulses.

Without a breakdown in the first and second locations it is expected that the first and second conductive interfaces are isolated from each other and virtually no electrical signal is expected to pass through the second conductive interface as a result of the zapping pulses.

The breakdowns (in the first and second locations) can be detected (very quickly) when the electrical signal is detected- or at least when the electrical signal raises above a noise threshold.

Step 430 may be followed by step 440 of stopping the generating of the zapping pulses in response to the detection of the occurrence of the breakdown.

The stopping may occur within few (one till twenty) nanoseconds, within few microseconds and the like.

Figure 10:
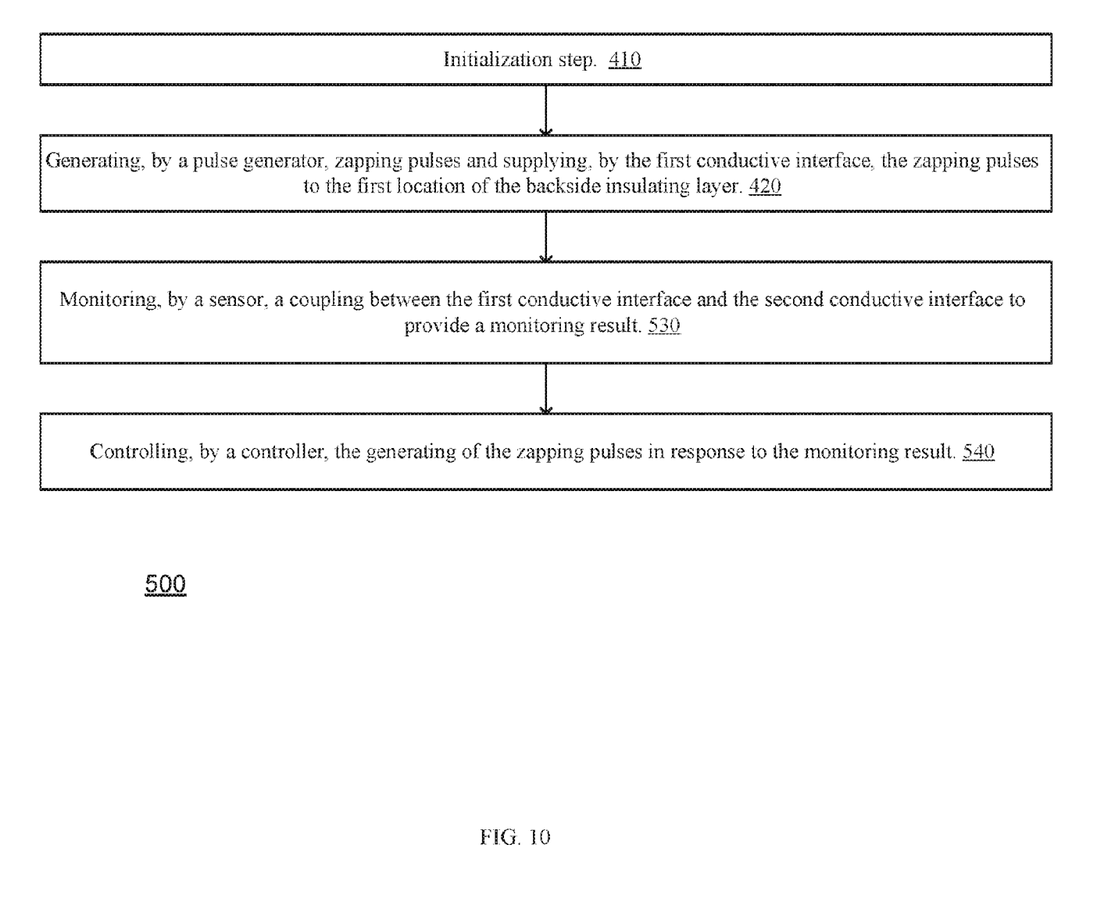
FIG. 10 illustrates a method according to an embodiment of the invention.

FIG. 10 illustrates method 500 according to an embodiment of the invention.

Method 500 may start by initialization step 410.

Initialization step 410 may be followed by step 420 of generating, by a pulse generator, zapping pulses and supplying, by the first conductive interface, the zapping pulses to the first location of the backside insulating layer.

Step 420 may be followed by step 530 of monitoring, by a sensor, a coupling between the first conductive interface and the second conductive interface to provide a monitoring result. The coupling refers to electrical coupling and may be represented by the presence and the value of an electrical signal that propagates (after the breakdowns) between first conductive interface and second conductive interface.

Step 530 may be followed by step 540 of controlling, by a controller, the generating of the zapping pulses in response to the monitoring result.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A system for zapping a wafer, the system comprising:
   a pulse generator;
   a sensor;
   a first conductive interface;
   a second conductive interface; and
   a controller;
   wherein the pulse generator is configured to generate zapping pulses;
   wherein the first conductive interface is configured to provide the zapping pulses to a first location of a backside insulating layer of the wafer;

wherein the sensor is configured to monitor a coupling between the first conductive interface and the second conductive interface to provide a monitoring result; wherein the monitoring occurs while the second conductive interface contacts a second location of the backside insulating layer; and wherein the controller is configured to control a generation of the zapping pulses in response to the monitoring result.

2. The system according to claim 1, wherein the sensor is configured to detect an occurrence of breakdowns of the backside insulating layer in the first location and in the second location; and wherein the controller is configured to stop generating the zapping pulses in response to a detection of the occurrence of the breakdowns.

3. The system according to claim 2, wherein the sensor is configured to detect occurrence of the breakdowns of the backside insulating layer in the first location and in the second location when an electrical signal that passes through the second conductive interface exceeds an intensity threshold.

4. The system according to claim 1, wherein the controller is configured to control at least one out of an intensity of the zapping pulses, duration of the zapping pulses and an interval between adjacent zapping pulses.

5. The system according to claim 1, wherein the pulse generator comprises an output stage that is configured to (a) output the zapping pulses when operating at a zapping mode, and (b) receive discharge current that passes through the first conductive interface when operating in a discharge mode.

6. The system according to claim 1, wherein the first conductive interface is coupled to the pulse generator via a resistor that is configured to limit a current of the zapping pulses below a predefined current threshold.

7. The system according to claim 1, wherein the first conductive interface is coupled to the pulse generator via a resistive path.

8. The system according to claim 1, further comprising an electrostatic chuck for supporting the wafer; and wherein the first conductive interface and the second conductive interface are configured to propagate through holes in the electrostatic chuck.

9. A method for zapping a wafer, the method comprising:
generating, by a pulse generator, zapping pulses;
supplying, by a first conductive interface, the zapping pulses to a first location of a backside insulating layer of the wafer;
contacting a second location of the backside insulating layer by a second conductive interface;
monitoring, by a sensor, a coupling between the first conductive interface and the second conductive interface to provide a monitoring result; and
controlling, by a controller, generating of the zapping pulses in response to the monitoring result.

10. A system for zapping a wafer, the system comprising:
a pulse generator;
a sensor;
a first conductive interface;
a second conductive interface; and
a controller;
wherein the pulse generator is configured to generate zapping pulses;
wherein the first conductive interface is configured to provide the zapping pulses to a first location of a backside insulating layer of the wafer;
wherein the sensor is configured to detect an occurrence of a breakdown of the backside insulating layer by monitoring an electrical signal that passes through the second conductive interface and through a second location of the backside insulating layer as a result of the zapping pulses; and
wherein the controller is configured to stop generating the zapping pulses in response to a detection of the occurrence of the breakdown.

11. The system according to claim 10, wherein the first conductive interface is coupled to the pulse generator via a resistor that is configured to limit a current of the zapping pulses below a predefined current threshold.

12. The system according to claim 10, wherein the first conductive interface is coupled to the pulse generator via a resistive path.

13. The system according to claim 10, wherein the pulse generator comprises an output stage that is configured to (a) output the zapping pulses when operating at a zapping mode, and (b) receive discharge current that passes through the first conductive interface when operating in a discharge mode.

14. The system according to claim 10, further comprising a diode for alternating current (DIAC) that is configured to prevent peaks of the electrical signal that are below a breakout voltage of the DIAC to reach the sensor.

15. The system according to claim 10, further comprising an electrostatic chuck for supporting the wafer; and wherein the first conductive interface and the second conductive interface are configured to propagate through holes in the electrostatic chuck.

* * * * *